United States Patent
Brabec et al.

(10) Patent No.: US 7,306,968 B2
(45) Date of Patent: Dec. 11, 2007

(54) METHOD FOR TREATING A PHOTOVOLTAIC ACTIVE LAYER AND ORGANIC PHOTOVOLTAIC ELEMENT

(75) Inventors: Christoph Brabec, Linz (AT); Pavel Schilinsky, Nürnberg (DE); Christoph Waldauf, Innsbruck (AT)

(73) Assignee: Konarka Technologies, Inc., Lowell, MA (US)

( * ) Notice: Subject to any disclaimer, the term of this patent is extended or adjusted under 35 U.S.C. 154(b) by 0 days.

(21) Appl. No.: 10/524,964

(22) PCT Filed: Sep. 3, 2003

(86) PCT No.: PCT/DE03/02929

§ 371 (c)(1),
(2), (4) Date: Sep. 26, 2005

(87) PCT Pub. No.: WO2004/025746

PCT Pub. Date: Mar. 25, 2004

(65) Prior Publication Data

US 2006/0105491 A1    May 18, 2006

(30) Foreign Application Priority Data

Sep. 5, 2002    (DE) .............................. 102 41 205

(51) Int. Cl.
*H01L 51/40* (2006.01)
*H01L 31/00* (2006.01)

(52) U.S. Cl. .................................. 438/99; 136/263
(58) Field of Classification Search ................. 438/99; 136/263
See application file for complete search history.

(56) References Cited

OTHER PUBLICATIONS

Christioph J. Brabec et al., "The Influence of Ordereing on the Photoinduced Charge Transfer in Composites of Phenyl-type Substituted Polythiophenes with Methanofullerenes", 1999 Material Research Society Proceedings, MRS Fall Symposium BB.*
Camaioni, Nadia et al. Solar cells based on poly(3-alkyl)thiophenes and [60]fullerene: a comparative study. *Journal of Materials Chemistry*, vol. 12, (2002), pp. 2065-2070.
Huynh, Wendy et al. Efficient Nanorod and Polymer Photovoltaics from Thermal Treatment. Electrochemical Society Proceedings, vol. 2001-10, (2001), pp. 195-198.
Arias, A.C., et al. Vertically segregated polymer-blend photovoltaic thin-film structures through surface-mediated solution processing. *Applied Physics Letters*, vol. 80, No. 10, (Mar. 11, 2002), pp. 1695-1697.

* cited by examiner

*Primary Examiner*—W. David Coleman
(74) *Attorney, Agent, or Firm*—Fish & Richardson P.C.

(57) ABSTRACT

The invention relates to an organically based photovoltaic element, in particular a solar cell comprising a photovoltaically active layer whose absorption maximum can be shifted into the longer wavelength region and/or whose efficiency can be increased.

20 Claims, 3 Drawing Sheets

Figure 1:
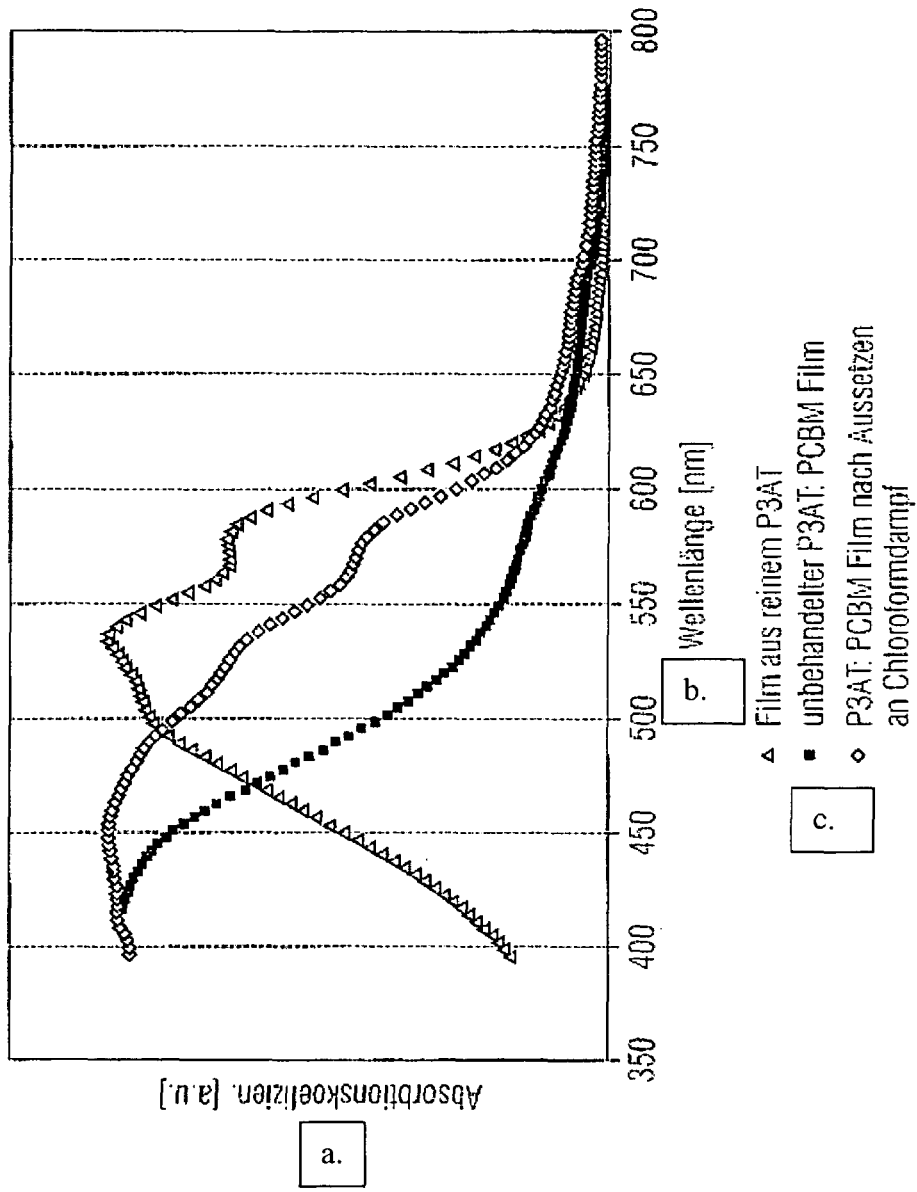

Key to Figure:
a. Absorption coefficient [AU]
b. Wavelength [nm]
c. Pure P3AT film
   Untreated P3AT:PCBM film
   P3AT:PCBM film after exposure to chloroform vapor

METHOD FOR TREATING A PHOTOVOLTAIC ACTIVE LAYER AND ORGANIC PHOTOVOLTAIC ELEMENT

This application is a national phase filing under 35 U.S.C. §371 of international application number PCT/DE2003/002929, filed Sep. 3, 2003, which claims priority to German application number 102 41 205.7, filed Sep. 5, 2002. These applications are incorporated by reference herein.

The invention relates to an organically based photovoltic element, particularly a solar cell comprising a photovoltaically active layer absorbing in the blue region.

Origanically based solar cella are known from U.S. Pat. No. 5,331,183 of 1994 and numerous subsequent publications.

Known in particular are organic solar cells based on polyalkylthiophene (P3AT). A typical cell structure for this photovoltaic element includes the following layers: an anode, composed, for example of ITO (indium tin oxide), overlain by a hole-conducting layer of a copolymer such as a mixture of PEDOT with PSS as the anion. Topping that is a layer of P3AT:PCBM [poly(3-hexylthiophene) mixed with phenyl$C_{61}$-butoxymethoxy], which is the photovoltaically active layer. Over that is the cathode layer, composed for example of a metal such as aluminum or a Ca/Ag alloy. The individual layers can differ from this scheme, however; in particular, both the electrodes and the acceptor (PCBM) can be made of another material. Cyano-substituted PPVs (CN PPVs), for example, have already been used as acceptors; but arbitrarily many additions to the polythiophene can be contemplated.

There is a need to shift the absorption maxima of the photovoltaically active layer into the longer wavelengths, since, for one thing, mixing polythiophene with fullerene causes a blue shift of the absorption maximum. This increases the mismatch, i.e., discrepancy, between the absorption maximum and the peak emission of sunlight.

An object of the invention is to provide a method by which the absorption maximum of a photovoltaically active layer can be shifted into the longer wavelength region and/or its efficiency improved (e.g. by increasing the short-circuit current). It is in particular an object of the present invention to provide a method by which the absorption maximum of a photovoltaically active layer containing a poly(alkyl) thiophene in mixture with a fullerene can be shifted into the longer wavelengths.

The invention is directed to a method for treating a photovoltaically active layer with a solvent and/or by annealing, characterized in that the photovoltaically active layer comes into contact with solvent, molecules and/or is heated. The invention is also directed to a photovoltaic element that comprises a photovoltaically active layer containing polyalkylthiophene in mixture and that absorbs in the deep red region.

The photovoltaically active layer is preferably a polyalkylthiophene that is present in mixture with an additive such as a fullerene, particularly a methanofullerene. Further possible additives instead of the fullerene would be, for example, inorganic nanoparticles based on CdTe (cadmium telluride), CdS (cadmium sulfide), polymers having a high electron affinity, such as, for example, cyano-substituted PPVs (CN PPVs) or small molecules having a high electron affinity, such as, for example, tetracyanoquinone (TCNQ) or tetracyanoanthraquinodimethane (TCAQ).

In one embodiment of the invention, the photovoltaically active layer is exposed to a solvent vapor at room temperature. This can be done, for example, by passing (holding) the photovoltaically active layer over a vessel containing solvent and/or conducting the solvent vapor over the photovoltaically active layer.

In one embodiment, the photovoltaically active layer is exposed to the solvent vapor only very briefly, i.e., for less than one minute or, for example, in only the second or millisecond range [syntax sic].

In one embodiment of the invention, the photovoltaically active layer is annealed at a temperature of at least 70° C., preferably about 80° C. or higher. The progress of the annealing can be monitored via the increase in the short-circuit current. Other temperature and time combinations are conceivable; the process is assumed to be completed as soon as the photovoltaic parameters cease to improve. The annealing can be performed by placing the photovoltaically active layer in a drying oven or on a hot plate or the like. The solvent treatment can also take place at the same time as the annealing.

The solvents used can, for example, be aromatic solvents such as xylene, toluene or the like, or halogen-containing solvents such as chloroform or the like. Choice of the right solvent depends on the mixture of the material forming the photovoltaically active layer. The effect of the solvent is, for example, that the solvents xylene, toluene, butanone and/or chloroform and/or a further solvent or an arbitrary mixture of said solvents at least partially etch and/or soften polyalkylthiophene.

The photovoltaically active layer is produced in a conventional manner; according to the state of the art, for example, a spin-coated film is formed from a P3AT [poly (3-alkylthiophene)]/PCBM (phenyl$C_{61}$-butoxymethoxy) solution or applied by standard printing methods (silk screening, flexography, etc.).

The figure is explained more specifically hereinbelow on the basis of three graphs reflecting test results.

FIG. 1 illustrates the observed effect of solvent vapors on the absorption of P3AT films spin-coated from chloroform, with and without fullerene, on glass. The triangles signify a pure P3AT film on glass and the solid squares a P3AT/PCBM film. It is clearly apparent that this film lacks the absorption contribution in the wavelength range around 550 nm that is typical of P3AT. Once the film has been exposed to chloroform vapor (open diamonds), its absorption behavior changes and the absorption characteristics typical of P3AT are again in evidence.

Figure 2:
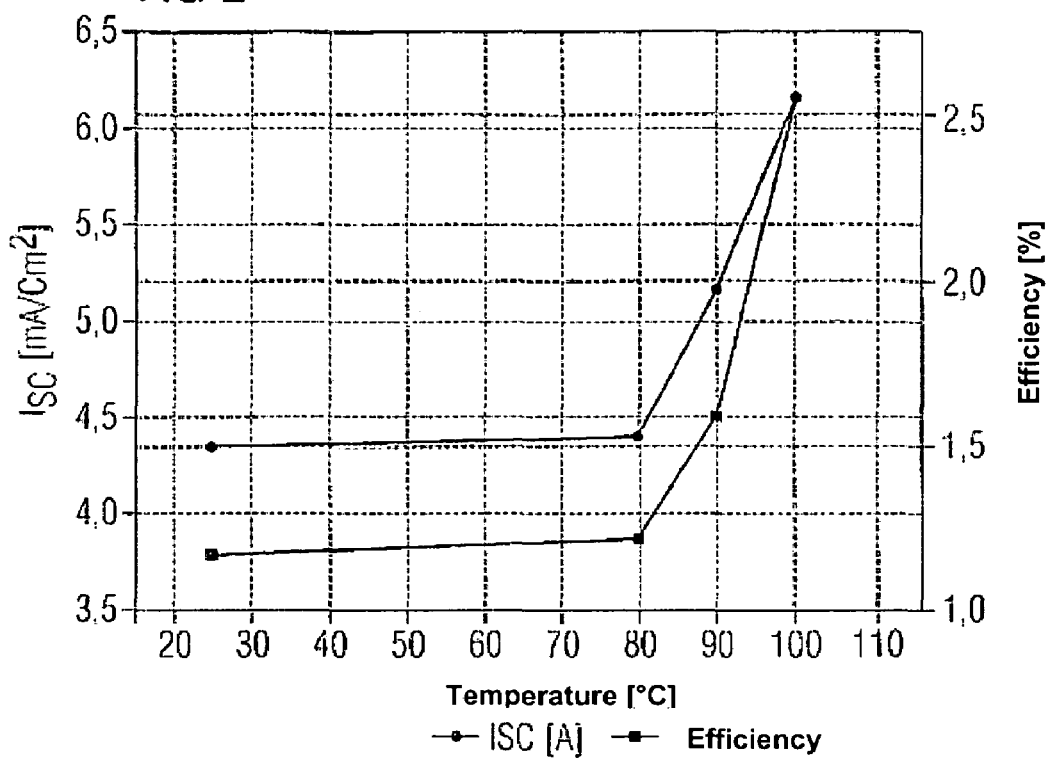

FIG. 2: variation of short-circuit current $I_{SC}$ (solid squares) and efficiency (solid circles) with the temperature at which the layer was annealed. Each specimen (structure: ITO/PEDOT/P3HT:PCBM/Ca/Ag) was annealed for 20 minutes and its electrical characteristics (Isc and efficiency) were measured at room temperature under illumination with 70 mW/cm$^2$ white light from a xenon lamp. It can be seen that the short-circuit current, and therefore the efficiency, begin to increase at a temperature of >80° C.

Figure 3:
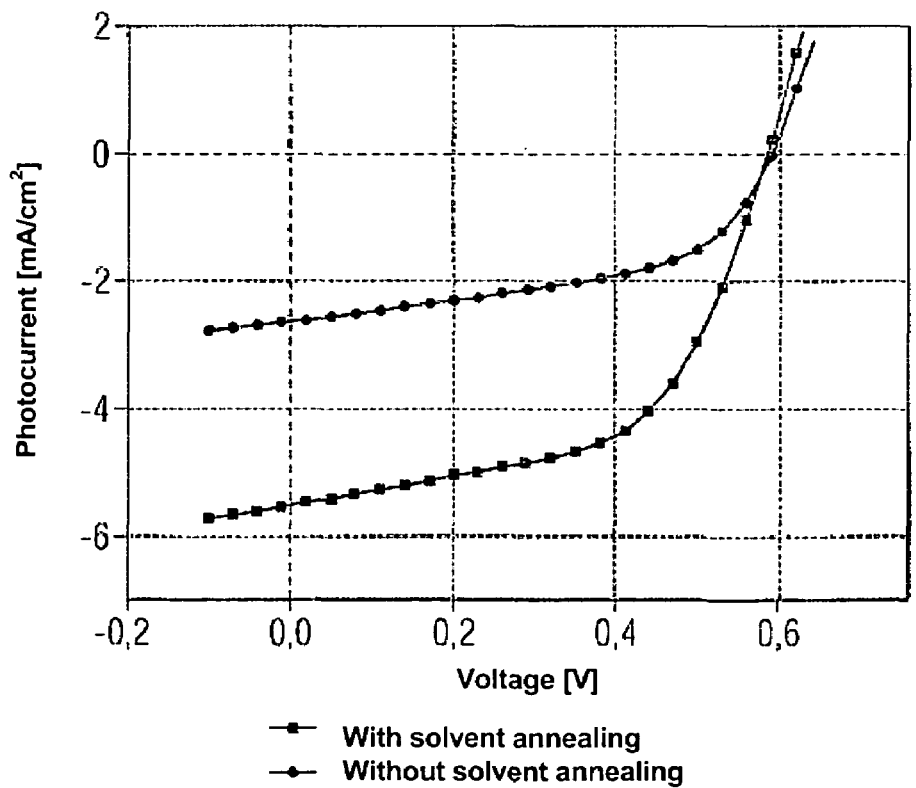

FIG. 3: current/voltage (I/V) characteristic of cells undergoing one temperature treatment before (solid circles) or after (solid squares) solvent vapor treatment. The increase in short-circuit current (Isc) and efficiency reflects the red shift in the absorption behavior of the cell (as illustrated in FIG. 1).

Figure 4:
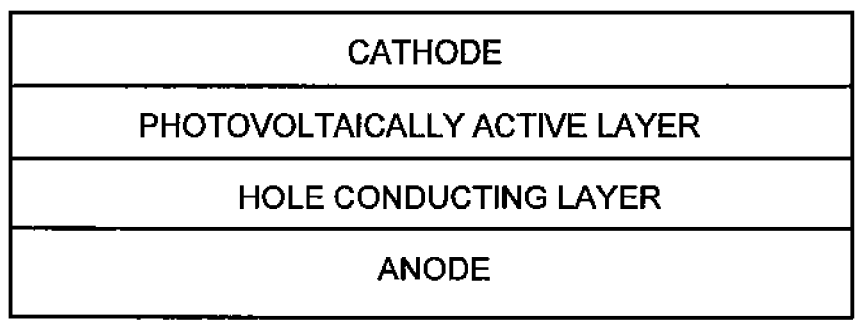

FIG. 4 illustrates an embodiment of a photovoltaic cell having an anode, a hole-conducting layer, a photovoltaically active layer, and a cathode.

Mixing P3ATs, especially polyhexylthiophenes, with fullerenes causes the absorption maximum of the P3AT to shift more than 100 nm into the blue spectral region. This increases the spectral mismatch between the solar cell and the sun's spectrum. The invention solves the following problems:

a.) shifting the absorption of P3AT/fullerene films back into the red spectral region by solvent annealing and b.) increasing the efficiency of the solar cell by temperature annealing.

"Annealing" denotes the treatment of a photovoltaically active layer in the context of this invention in order to achieve the object, i.e., to bring about a red shift in the absorption maximum of the layer.

The invention claimed is:

1. A method for treating a photovoltaically active layer that includes a polymer comprising a polyalkylthiophene and a fullerene, the method comprising:

heating the photovoltaically active layer to a temperature of at least 70° C.

2. The method as defined in claim 1, wherein the fullerene comprises a methanofullerene.

3. The method as defined in either of claim 1, wherein the photovoltaically active layer is exposed to a solvent vapor.

4. The method as defined in claim 1, wherein the photovoltaically active layer is heated to a temperature of at least 80° C.

5. The method of claim 1, wherein, after treating, said photovoltaically active layer has an absorption maximum in the deep red region.

6. The method as defined in claim 3, wherein the photovoltaically active layer is exposed to the solvent vapor at room temperature.

7. The method as defined in claim 3, wherein the photovoltaically active layer is exposed to the solvent vapor for no longer than one minute.

8. The method as defined in claim 3, wherein the solvent comprises a solvent selected from the group consisting of xylene, toluene, butanone, chloroform, and mixtures thereof.

9. A method of treating a photovoltaically active layer that includes a polymer comprising a polyalkylthiophene and a fullerene, the method comprising:

contacting the photovoltaically active layer with a solvent vapor.

10. The method as defined in claim 9, wherein the fullerene is mixed with the polymer.

11. The method of claim 9, wherein the photovoltaically active layer contacts the solvent vapor at room temperature.

12. The method of claim 9, wherein the solvent comprises at least one solvent selected from the group consisting of xylene, toluene, butanone, chloroform and mixtures thereof.

13. The method of claim 9, wherein the solvent at least partially etches or softens the polymer.

14. The method of claim 9, further comprising heating the photovoltaically active layer.

15. The method of claim 9, wherein, after treating, the photovoltaically active layer has an absorption maximum in the deep red region.

16. The method of claim 10, wherein the fullerene comprises a methanofullerene.

17. The method of claim 16, wherein the photovoltaically active layer contacts the solvent vapor for no longer than one minute.

18. The method of claim 14, wherein the photovoltaically active layer is heated to a temperature of at least 70° C.

19. A method of treating a photovoltaically active layer that includes a polyalkylthiophene and a methanofullerene, comprising:

heating the photovoltaically active layer at a temperature of at least 70° C.

20. The method of claim 19, wherein, after treating, the photovoltaically active layer has an absorption maximum in the deep red region.

* * * * *